United States Patent

Salama

[11] 4,311,870
[45] Jan. 19, 1982

[54] EFFICIENCY OF SILICON SOLAR CELLS CONTAINING CHROMIUM

[76] Inventor: Robert A. Frosch, Administrator of the National Aeronautics and Space Administration, with respect to an invention of Amal M. Salama, New Port Beach, Calif.

[21] Appl. No.: 185,867

[22] Filed: Sep. 11, 1980

[51] Int. Cl.³ .................... H01L 31/06; H01L 31/18
[52] U.S. Cl. .................... 136/261; 136/290; 148/1.5; 357/30; 357/63; 219/121 LN
[58] Field of Search ........... 136/261, 290; 148/1.5; 29/572; 357/30, 63; 219/121 LN

[56] References Cited

U.S. PATENT DOCUMENTS

| | | | |
|---|---|---|---|
| 4,124,410 | 11/1978 | Kotval et al. | 136/258 |
| 4,147,563 | 4/1979 | Narayan et al. | 148/1.5 |
| 4,181,538 | 1/1980 | Narayan et al. | 148/1.5 |
| 4,201,622 | 5/1980 | Salama | 156/605 |
| 4,249,957 | 2/1981 | Koliwad et al. | 136/258 |

OTHER PUBLICATIONS

E. Fogarassy et al., "Laser Treatment of Phosphorus-Diffused Silicon Solar Cells", *Solar Cells*, vol. 1, pp. 23-28 (1979/1980).
J. C. Muller et al., "Laser Processing in the Preparation of Silicon Solar Cells", *IEEE Trans. Electron Devices*, vol. ED-27, pp. 815-821 (1980).
G. F. Wakefield et al., "Influence of Impurities on Silicon Solar Cell Performance", *Conf. Record, 11th IEEE Photovoltaic Specialists Conf.* (1975), pp. 49-55.
D. E. Hill et al., "The Effect of Secondary Impurities on Solar Cell Performance", *Conf. Record, 12th IEEE Photovoltaic Specialists Conf.* (1976), pp. 112-119.

*Primary Examiner*—Aaron Weisstuch
*Attorney, Agent, or Firm*—Thomas H. Jones; John R. Manning

[57] ABSTRACT

Efficiency of silicon solar cells containing about $10^{15}$ atoms/cm³ of chromium is improved about 26% by thermal annealing of the silicon wafer at a temperature of 200° C. to form chromium precipitates having a diameter of less than 1 Angstrom. Further improvement in efficiency is achieved by scribing laser lines onto the back surface of the wafer at a spacing of at least 0.5 mm and at a depth of less than 13 micrometers to preferentially precipitate chromium near the back surface and away from the junction region of the device. This provides an economical way to improve the deleterious effects of chromium, one of the impurities present in metallurgical grade silicon material.

14 Claims, 5 Drawing Figures

EFFICIENCY OF SILICON SOLAR CELLS CONTAINING CHROMIUM

ORIGIN OF THE INVENTION

The invention described herein was made in the performance of work under an Interagency agreement between the Department of Energy and the National Aeronautics and Space Administration in continuation of the work under NASA prime contract NAS7-100 between NASA and the California Institute of Technology, and is subject to the provisions of Section 305 of the National Aeronautics and Space Act of 1958, Public Law 83-568 (72 Statute 435; 42 USC 2457).

TECHNICAL FIELD

The present invention relates to improved photovoltaic solar cells and, more particularly, to silicon solar cells containing chromium.

BACKGROUND ART

Self sufficiency in energy is a stated national goal. Most of the proposed means to achieve this goal are either environmentally unacceptable or are not feasible, especially those not depending on fossil fuel sources. Of the available alternatives, solar energy is the most abundant, inexhaustable single resource available. However, capturing and utilizing solar energy is not simple. Methods are being sought to convert solar energy to a concentrated, storable form of energy.

One method of converting solar energy to a usable form being prominently considered is the deployment of large arrays of photovoltaic solar cells, especially in the sunbelt areas such as the southwestern and western regions of the United States. The most promising candidate for the solar cell is a doped silicon material and silicon is one of the most plentiful elements in the earth's crust. However, the economic feasibility depends on processing cost and presently the most efficient cells are produced from pure single crystal silicon.

There is a need for lower cost solar cell grade silicon. Chromium is one of the inherent impurities of concern in metallurgical grade silicon. Presently chromium is removed from silicon utilized for solar cell manufacture at substantial cost since the chromium impurity is electrically active, forming deep traps which substantially impair performance of solar cells.

DISCLOSURE OF INVENTION

It has now been discovered in accordance with this invention that the efficiency of solar cells produced from metallurgical grade silicon containing substantial chromium concentrations can be substantially improved without removing the chromium. The improvement in efficiency is from 26% to 33%. Metallurgical grade silicon is readily processed at low cost in the process of the invention. The process of the invention can be performed on silicon, usually in wafer form, before the wafers are processed into solar cells.

Silicon containing chromium impurities is processed in accordance with the invention by inducing chromium precipitation by thermal annealing at a temperature of at least 200° C. for a period of one to two hours. During thermal annealing the chromium migrates to the defects or imperfections and forms precipitates. It was further discovered that the diameter of the precipitates must be controlled. If the precipitate particle size is too large, degradation may occur. Therefore, the precipitates should be less than 1.0 Angstroms, preferably less than about 0.5 Angstroms.

In another aspect of the invention, a pretreatment to activate dislocations on the back side of the wafer is conducted to avoid aging effects of the chromium precipitates particles in the solar cell bulk and in the junction depletion region. This results in locating most of the precipitation along the back surface of the device far removed from affecting the junction depletion region.

Controlled back surface damage by a laser beam results in generation of strain fields in the wafer. During high temperature processing, the strain is released through the generation of defects and dislocations which act as effective gettering sites for impurities and precipitates. The precipitate particle growth will not affect the cell performance as long as the laser damage depth does not propagate to the cell front surface during annealing or cell fabrication.

It was discovered that optimum cell characteristics result when both the laser damage depth and line scan spacing are controlled. The line spacing should be greater than 0.5 mm and the laser damage depth should not exceed 13 micrometers.

The process of the invention is practiced on single crystal chromium-doped silicon. The process is capable of effectively gettering chromium concentrations of $10^{13}$ to $10^{16}$ atoms/cm$^3$, though the usual chromium concentration in metallurgical grade silicon is usually about $10^{15}$ atoms/cm$^3$. Solar cell devices can be fabricated by conventional techniques. The crystal or wafer is rendered P-type by introducing P-type atoms, usually boron or aluminum at a typical concentration of $10^{16}$ atoms/cm$^3$. An N-junction is formed on the front surface by introducing N-type atoms such as phosphorous. It is preferred to introduce phosphorous by diffusion rather than ion implantation techniques since phosphorous is a gettering agent for impurities and tends to drive chromium away from the depletion region of the junction during thermal diffusion. Front and rear metallized contacts are then applied and a tantalum pentoxide or silicon dioxide antireflective coating may be coated onto the front surface of the device.

These and many other advantages and attendant features of the invention will become apparent as the invention becomes better understood by reference to the following detailed description when considered in conjunction with the accompanying drawings.

DETAILED DESCRIPTION OF THE INVENTION

Figure 1:
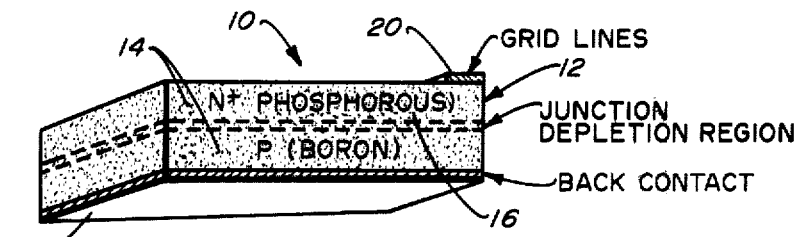
FIG. 1 is a schematic view of a solar cell device in accordance with the invention.

Referring now to FIG. 1, a photovoltaic solar cell device 10 of the invention includes a silicon wafer 12 containing fine chromium precipitates 14. The bulk of the wafer is P-type from a boron dopant, and includes a layer 16 of second conductivity, usually N-type from a phosphorous dopant, forming an N-P junction. A first metallized contact 18 is provided across the back surface of the device and a second discontinuous metallized contact 20 is provided on the front surface facing the sun. The front surface may be provided with an antireflective coating, not shown. When solar radiation is absorbed by the wafer 12, electron hole pairs are generated inducing a voltage between the contacts 18,20.

The wafer may be circular or rectangular and can be produced from cast or grown ingots. Boron or aluminum-doped P-type silicon may be used. The N-P junction can be formed by phosphorus diffusion. Contacts are usually fabricated by evaporating metal onto the surfaces of the wafer.

Figure 2:
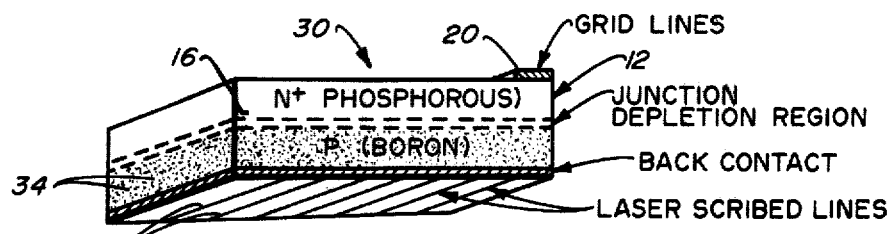
FIG. 2 is a schematic view of a laser treated solar cell device in accordance with this invention.

FIG. 2 illustrates a back surface laser-damaged solar cell 30 in which a laser is utilized to scribe lines 32 onto the back surface of the wafer 12. The imperfections induced by the laser damage cause the chromium precipitates 34 to congregate preferentially near the back surface lines 32 away from the junction depletion region. Examples of practice follow:

EXAMPLE 1

The $1 \times 2$ cm$^2$, 0.025 cm-thick wafers used were cut from ingots with <111> growth axes prepared by Czochralski techniques. The chromium was added to the ingots during the melting process at ~1412° C. The seed silicon material was boron-doped to a concentration of ~$10^{16}$ atoms/cm$^3$. The chromium doping level was $1 \times 10^{15}$ atoms/cm$^3$, as determined by neutron activation analysis.

The junction diffusion process was performed at 920° C. using standard solar cell fabrication techniques with phosphine as the phosphorus source. Thin films of Ti/Pd/Aq metallization were evaporated on the diffused wafers to form the contacts of the solar cells, and tantalum pentoxide was used as antireflective coating.

Devices for capacitance studies were prepared by forming Schottky barrier diodes on silicon wafers.

EXAMPLE 2

Induced chromium precipitation gettering:

The 1 cm$\times$2 cm$\times$0.025 cm polished wafers described in Example 1 were thermally annealed at 200° C. in a N$_2$ atmosphere for one hour, then pulled rapidly and dipped in ethylene glycol. They were then rinsed with DI water and dried. Some samples were cut into small specimens and thinned for transmission electron microscopy (TEM) examination. Schottky barrier diodes were prepared on some other wafers for deep level transient spectroscopy (DLTS) measurements. A batch of six solar cells was fabricated from the same heat-treated wafers. Samples for Hall measurements using the Van der Pauw technique were also prepared. Similar specimens and solar cells were prepared and examined from the unannealed chromium-doped silicon wafers. The TEM, DLTS, and Hall measurements for the two sets of samples were compared.

RESULTS

Transmission electron microscopy (TEM). The unannealed specimens showed no precipitation, whereas the annealed specimens showed fine precipitate particles of diameter 0.04 µm. The precipitate concentration as determined from the micrographs was ~$1.2 \times 10^{14}$ atoms/cm$^3$.

Deep level transient spectroscopy (DLTS). The method used to measure the concentration of carrier trapping centers is similar to the DLTS method reported by Lang, J. Appl. Phys., 45, 3014, 3023 (1974).

The samples used were in the form of Schottky diodes. They were prepared from the wafers described previously. The Schottky barrier was prepared by titanium evaporation of freshly-etched wafers.

The results indicated that the concentration of the electrically active centers found at ($E_V+0.3$ eV) was reduced by about 50–60% of their concentration before annealing; i.e., from $5.1 \times 10^{14}$ cm$^{-3}$ to $2.7 \times 10^{14}$ cm$^{-3}$.

Figure 3:
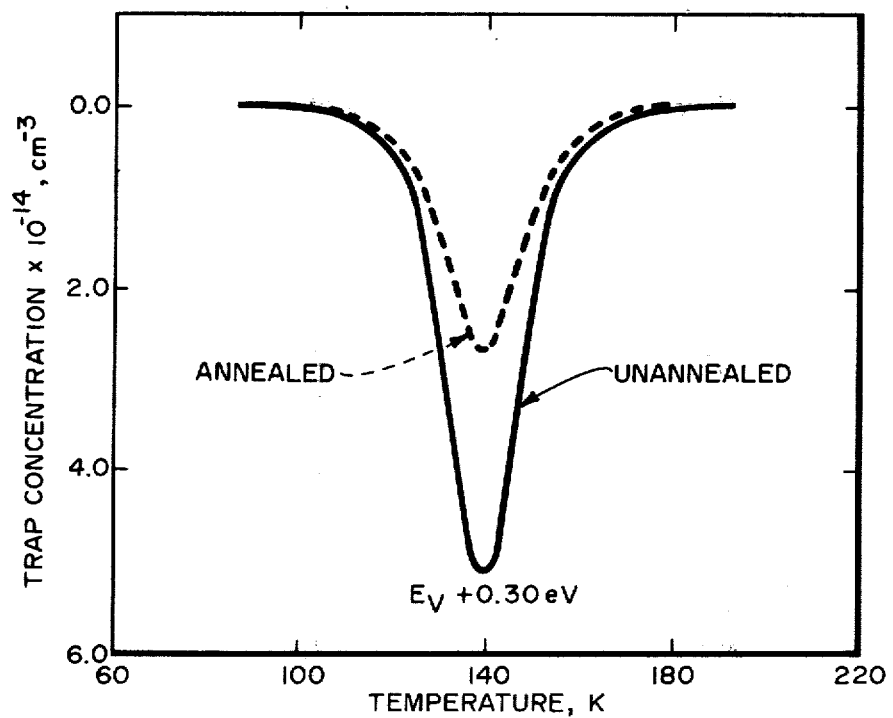
FIG. 3 are a set of DLTS Spectra of Cr-doped, annealed and unannealed Schottky diodes.

The majority carrier concentration for the unannealed sample was $3.50 \times 10^{15}$ cm$^{-3}$, which increased to $4.1 \times 10^{15}$ cm$^{-3}$ for the annealed samples. These results were also confirmed by Hall measurement results, which indicated reduced compensation effects after the chromium precipitation. The temperature dependence of the carrier emission rate for the annealed and unannealed samples is given in FIG. 3.

Hall Measurements. The Van der Pauw technique was used on baseline samples (undoped with Cr), Cr-doped annealed, and unannealed samples. Four ohmic contacts were prepared on the samples by ultrasonic soldering of Au contacts using In solder and by the electrical sparking method. The measurements were carried out from liquid He temperature to room temperature. The low temperature measurements will be analyzed and reported later. It was found that the majority carrier concentration of the samples increased from $3.44 \times 10^{15}$ cm$^{-3}$ to $4.00 \times 10^{15}$ cm$^{-3}$ after the precipitation annealing. This result, together with the DLTS results, gives evidence to the reduced compensation effects of chromium after the precipitation annealing, i.e., the gettering effect.

EXAMPLE 3

Induced Laser Damage Gettering:

The back surfaces of the Cr-doped wafers described in Example 1 were damaged using a Q-switched Nd:YAG laser beam operated at a wavelength of 1.06 µm. The damage was arranged in parallel scan lines at constant spacings. The spacings of the damage lines in the wafers under investigation were 0.12 and 0.5 mm. The laser beam was focused through a 27-mm objective, and the spot size was 40 µm. Three different damage depths were investigated by changing the energy density of the beam using 16, 28, and 56 J/cm$^2$. The corresponding apparent depths of damage as determined by profilometer measurements were 9.2, 12.0 and 14.2 µm respectively.

After the induced laser damage in the wafers, the wafers were annealed at 200° C. for 50 minutes in a nitrogen atmosphere to induce chromium precipitation. Then the wafers were fabricated into solar cells as described previously.

RESULTS

Hall Measurement. The room temperature Hall measurement results on the laser-damaged wafer gave a majority carrier concentration of $5.6 \times 10^{15}$ cm$^{-3}$. This result corresponded to the carrier concentration of the baseline silicon material (undoped with Cr), giving evidence that there were no compensation effects due to Cr.

Figure 4:
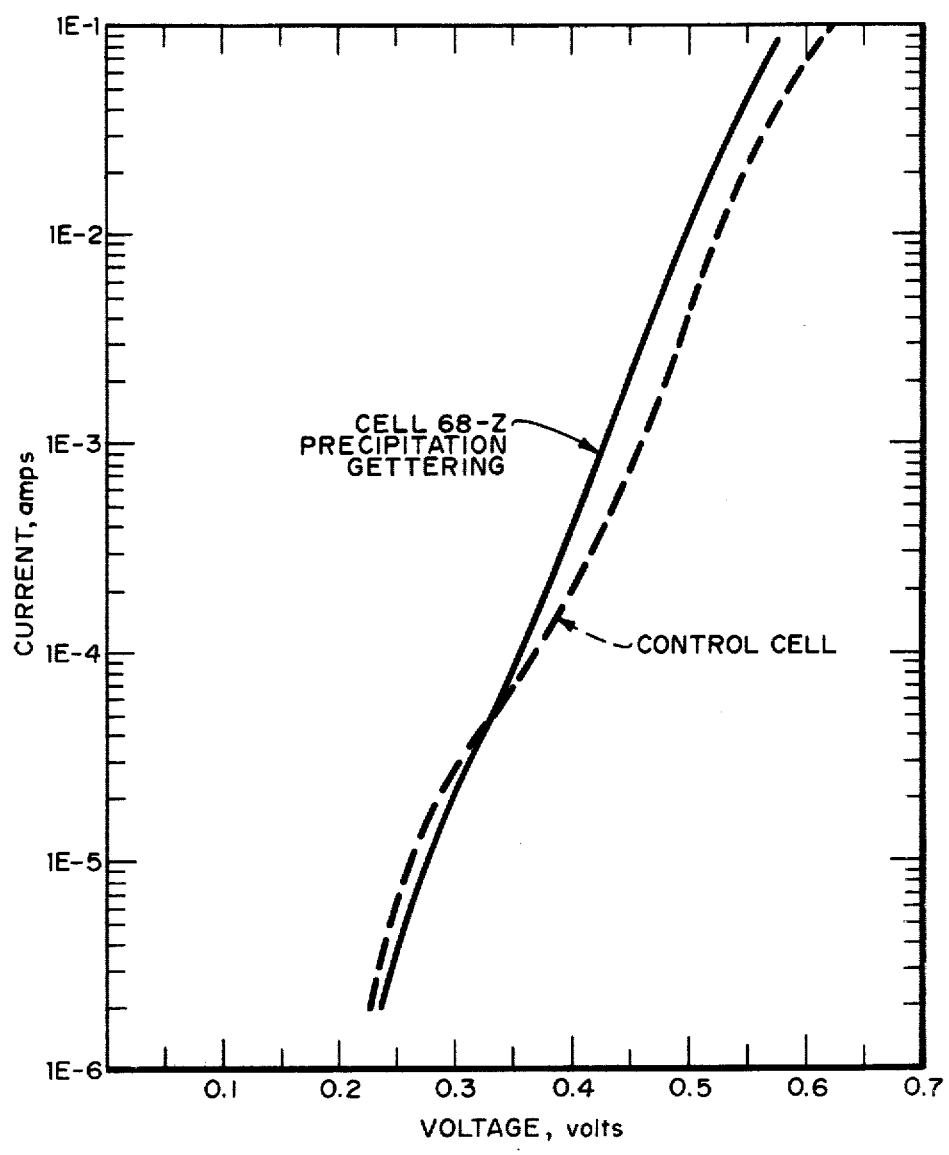
FIG. 4 illustrates a set of curves showing Dark Forward IV characteristics of a precipitation gettered cell and a control cell.
Figure 5:
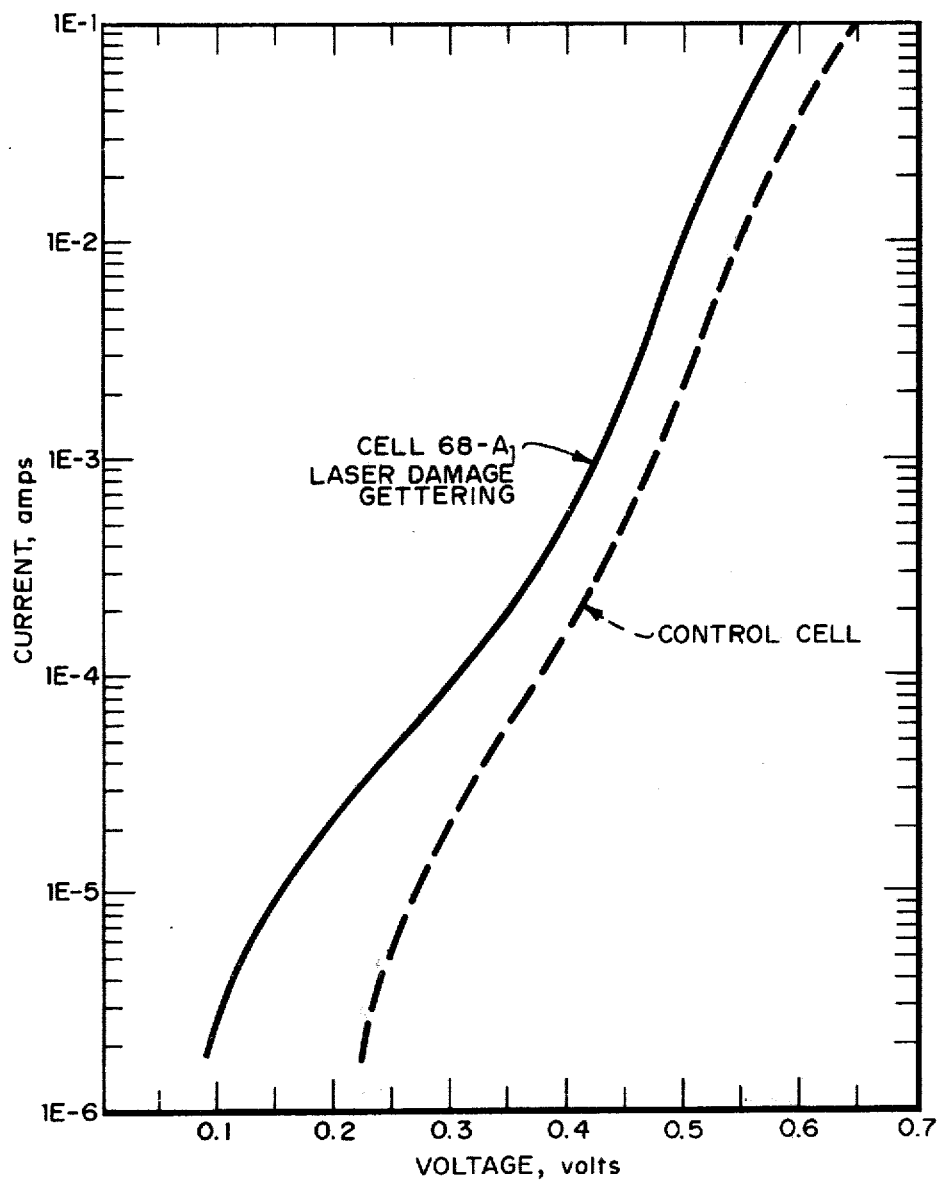
FIG. 5 illustrates a further set of curves showing Dark Forward IV characteristics of a laser damage gettered cell and a control cell.

Solar Cell Evaluation. Light I-V measurements were performed on the three batches of chromium-doped silicon solar cells; i.e., the ungettered, the precipitation gettered, and the laser-damaged and annealed solar cells. The light I-V measurements were performed under AMO conditions and the average of the solar cell parameters is given in Table I. The dark forward I-V measurements of the precipitation gettered, and the laser-damaged and annealed solar cells are given in FIGS. 4 and 5 respectively.

As seen in Table I, the conversion efficiencies (~8.14%) of the precipitation gettered solar cells have increased by 26% over the ungettered cells (of ~6.45%). The conversion efficiencies (~8.55%) of the laser damaged and annealed cells, when the damage depth was ~9.2 μm, increased by 33% over the ungettered cells. It is also noticeable that the cells with damage line spacings of ~0.5 mm have slightly better performance than the ones of ~0.12 mm spacings.

through aging, then, degradation may occur. In order to counteract this effect, back-surface laser damage is more effective. During the high temperature processing, the strain is released through the generation of dislocations. The dislocations act as effective gettering sites for impurities and precipitates. The precipitate particles growth will not affect the cell performance as long as the laser damage does not propagate to the cell front surface during processing. The effectiveness of the laser gettering is controlled by the scan line spacing. The line spacings determine the density of damage sites. The spacing of 0.5 mm is shown to be a critical spacing below which the laser damage is not as effective.

Due to the high solid solubility of chromium ($2.2 \times 10^{13}$ cm$^{-3}$ at 900° C.) and its fast diffusion ($D_{Cr}$ at 900° C. $= 0.51 \times 10^{-6}$ cm$^2$/sec) in silicon, it can easily be gettered at as low a temperature as 200° C. and during the high temperature solar cell processing (~900° C.). The invention demonstrates that inducing chromium

TABLE I
LIGHT CURRENT - VOLTAGE SOLAR CELL CHARACTERISTICS

| CELL ID NO. | $I_{sc}$ mA | $V_{oc}$ mV | $P_{max}$ mW | EFFICIENCY % | FILL FACTOR | TYPE OF GETTERING | AVERAGE EFFICIENCY, η % | % ($\eta_{Cr}/\eta$) |
|---|---|---|---|---|---|---|---|---|
| 68-1(S) | 56.52 | 513.1 | 17.5 | 6.39 | 0.601 | NONE (S = SEED) | | |
| 68-2(C) | 56.59 | 517.6 | 17.9 | 6.55 | 0.689 | NONE (C = CENTER) | 6.45 | 66% |
| 68-3(T) | 56.66 | 513.0 | 17.4 | 6.42 | 0.596 | NONE (T = TANG) | | |
| 68-S (S) | 56.59 | 524.0 | 22.3 | 8.08 | 0.750 | PRECIPITATION | | |
| 68-X (T) | 54.83 | 525.3 | 22.0 | 8.13 | 0.763 | GETTERING | 8.14 | 82% |
| 68-Z (C) | 56.6 | 526.3 | 22.6 | 8.21 | 0.759 | | | |
| 68-A$_1$* | 59.5 | 527.5 | 23.5 | 8.63 | 0.750 | LASER DAMAGE | | |
| 68-A$_2$* | 58.64 | 527.0 | 23.3 | 8.47 | 0.753 | GETTERING: | 8.55 | 88% |
| | | | | | | A$_1$, B$_1$, C$_1$ | | |
| 68-B$_1$** | 56.13 | 523.9 | 20.5 | 7.52 | 0.695 | EXHIBIT LINE | | |
| 68-B$_2$** | 54.25 | 515.8 | 17.7 | 6.52 | 0.632 | SPACING = 0.5 mm | 7.02 | 72% |
| | | | | | | A$_2$, B$_2$, C$_2$ | | |
| 68-C$_1$+ | 54.79 | 522.9 | 20.1 | 7.44 | 0.701 | EXHIBIT LINE | 6.52 | 67% |
| 68-C$_2$+ | 53.9 | 509.9 | 15.3 | 5.61 | 0.557 | SPACING = 0.12 mm | | |
| C-1 | 137.8 | 555.1 | 50.1 | 9.28 | 0.654 | CONTROL CELLS | | |
| C-2 | 135.8 | 574.8 | 59.0 | 10.92 | 0.756 | (NO CHROMIUM ADDED) | 9.75 | |
| C-3 | 132.8 | 577.0 | 52.9 | 9.75 | 0.698 | | | |
| C-4 | 132.0 | 571.2 | 49.1 | 9.08 | 0.651 | | | |

*A-TYPE CELLS HAVE DAMAGE DEPTH OF ~9.2 μm
**B-TYPE CELLS HAVE DAMAGE DEPTH OF ~12.0 μm
+C-TYPE CELLS HAVE DAMAGE DEPTH OF ~14.2 μm

However, the cells that had line depths of 12.0 and 14.2 μm showed conversion efficiency improvements of 9% and 1%, respectively, over the ungettered cells. This indicates that a certain amount of damage must be generated in gettering the wafers, beyond which damage in the p-n junction depletion region may occur, thereby degrading the solar cell performance. These results agree with the findings on MOS devices. However, it was apparent that damage line spacings of less than 0.5 mm also cause solar cell degradation.

The results show that the two techniques utilized for gettering, i.e., chromium precipitation and back surface laser damage and annealing, were successful in improving the chromium doped silicon solar cell conversion efficiency. However, the laser-induced damage is found to have a greater effect in improving the cell's electrical performance only if the damage depth does not exceed 9-12 μm and if the laser line-spacing is 0.5 mm. This is evident from the TEM, DLTS, and Hall measurement results. The induced chromium precipitation at the annealing temperature of 200° C. reduced the concentration of the electrically-active chromium centers, thereby reducing the compensation effect of chromium and improving the conversion efficiency. However, if the precipitate particle size increased too much, such as precipitation in silicon wafers containing chromium at a concentration $\sim 1 \times 10^{15}$ atoms/cm$^3$ by annealing at 200° C. for about one hour, the concentration of electrically active centers was reduced. The precipitate particle diameter was ~0.4 Angstroms. To avoid aging effects of the precipitate particles in the solar cell bulk and junction depletion region, back-surface precipitation is preferred. This was achieved by using back surface laser damage, then inducing precipitation there, by annealing the wafers at 200° C. The important damage parameters are the laser damage depth and the scanned line spacing. The gettering arises from the strain fields and defects generated through the local heating by the laser beam. During the high temperature processing (920° C.), the strain in the wafers is released through generation of new dislocations, nucleation of precipitates, and segregation of other impurities at the laser induced dislocations on the back surface, away from the junction depletion region. However, there are optimum conditions for the laser gettering. It was found from this work that the optimum laser damage parameters are a damage depth of ~9-12 μm and a scanned line spacing of 0.5 mm. The corresponding energy density to produce this damage depth was 16-28 J/cm$^2$. At 56 J/cm$^2$, where the damage depth was ~14 μm, degradation of the cell efficiencies occurred.

It is to be understood that only preferred embodiments of the invention have been described and that numerous substitutions, alterations and modifications are all permissible without departing from the spirit or scope of the invention as defined in the following claims.

I claim:

1. A photovoltaic solar cell device comprising
   a silicon wafer doped with an element providing a first conductivity type and containing $10^{13}$ to $10^{16}$ atoms/cm$^3$ of chromium in the form of precipitates having a diameter less than 1 Angstrom and containing a surface layer of opposed conductivity type; and
   contact means connected to each of said conductivity portions of the wafer.

2. A device according to claim 1 in which the element providing said first conductivity type is boron and the element providing said second conductivity type is phosphorous.

3. A device according to claim 1 in which the chromium concentration is about $10^{15}$ atoms/cm$^3$.

4. A device according to claim 1 further including an antireflective coating on the front surface of the device.

5. A device according to claim 1 further including a series of spaced lines scribed onto the bottom surface of the wafer by means of a laser.

6. A device according to claim 5 in which the lines are spaced at least 0.5 mm apart.

7. A device according to claim 6 in which the lines are scribed into the bottom surface to a depth of no more than 13 micrometers.

8. A device according to claim 7 in which the depth is from 9 to 12 micrometers.

9. A device according to claim 8 in which the spacing is from 0.5 to 1.0 mm.

10. A method of improving the efficiency of silicon solar cell devices in which the silicon contains a concentration of chromium of from $10^{13}$ to $10^{16}$ atoms/cm$^3$ comprising the step of thermally annealing the silicon before fabricating a device at a temperature of at least 200° C. for a time sufficient to form chromium precipitates having a diameter of less than 1 Angstrom.

11. A method according to claim 10 in which the silicon is thermally annealed at a temperature of at least 200° C. for a period of one hour to two hours.

12. A method according to claim 11 further including the step of scribing laser lines onto the back surface of the silicon before thermal annealing.

13. A method according to claim 12 in which the lines are spaced at least 0.5 mm apart and are scribed into the surface to a depth of less than 14 μm.

14. A method according to claim 13 in which the spacing is no less than 0.5 mm and the depth is from 9 to 12 micrometers.

* * * * *